(12) United States Patent
Mizuhara

(10) Patent No.: US 9,203,522 B2
(45) Date of Patent: Dec. 1, 2015

(54) PHASE LOCK LOOP CONTROL FOR DIGITAL COMMUNICATION SYSTEMS

(75) Inventor: Osamu Mizuhara, Allentown, PA (US)

(73) Assignee: Finisar Corporation, Horsham, PA (US)

( * ) Notice: Subject to any disclaimer, the term of this patent is extended or adjusted under 35 U.S.C. 154(b) by 1230 days.

(21) Appl. No.: 12/194,122

(22) Filed: Aug. 19, 2008

(65) Prior Publication Data

US 2010/0046959 A1 Feb. 25, 2010

(51) Int. Cl.
*H04B 10/00* (2013.01)
*H04B 10/69* (2013.01)
*H03L 7/06* (2006.01)
*H04L 7/00* (2006.01)
*H03L 7/095* (2006.01)

(52) U.S. Cl.
CPC *H04B 10/69* (2013.01); *H03L 7/06* (2013.01); *H04L 7/0083* (2013.01); *H03L 7/095* (2013.01)

(58) Field of Classification Search
USPC ............................ 398/138, 202–204, 208, 211
See application file for complete search history.

(56) References Cited

U.S. PATENT DOCUMENTS

| | | | | |
|---|---|---|---|---|
| 4,330,870 A | * | 5/1982 | Arends | 398/129 |
| 5,414,414 A | * | 5/1995 | Suzuki | 340/2.9 |
| 6,076,175 A | * | 6/2000 | Drost et al. | 714/704 |
| 6,307,413 B1 | | 10/2001 | Dalmia et al. | |
| 6,735,259 B1 | * | 5/2004 | Roberts et al. | 375/316 |
| 7,089,444 B1 | * | 8/2006 | Asaduzzaman et al. | 713/600 |
| 7,382,987 B2 | * | 6/2008 | Misaizu et al. | 398/202 |
| 2005/0047793 A1 | * | 3/2005 | Butler et al. | 398/149 |
| 2009/0005103 A1 | * | 1/2009 | Eisenstadt et al. | 455/522 |
| 2010/0046959 A1 | * | 2/2010 | Mizuhara | 398/155 |

OTHER PUBLICATIONS

HFTA-07.0: Precision Reference Clock Usage in Clock and Data Recovery Circuits, pp. 1-4, http/www.maxim-ic.com/appnotes.cfm/an_pk/1925.

* cited by examiner

*Primary Examiner* — David Payne
*Assistant Examiner* — Tanya Motsinger
(74) *Attorney, Agent, or Firm* — Kurt Rauschenbach; Rauschenbach Patent Law Group, LLC

(57) ABSTRACT

An optical receiver includes an optical detector that is positioned to detect an optical data signal received from an optical channel generates a received electrical data signal at an output. An electrical switch passes one of the received electrical data signal and a second electrical signal depending upon a control signal applied to a control input. A data and clock recovery circuit generates a recovered clock and a recovered data signal when a signal-to-noise ratio of the received electrical signal is in a range where a signal locking condition is established, and generates the control signal at the control output that instructs the electrical switch to select the received electrical data signal if the signal locking condition is established and to select the second electrical signal if the signal locking condition is not established.

18 Claims, 6 Drawing Sheets

PHASE LOCK LOOP CONTROL FOR DIGITAL COMMUNICATION SYSTEMS

The section headings used herein are for organizational purposes only and should not to be construed as limiting the subject matter described in the present invention.

BACKGROUND OF THE INVENTION

Optical receivers for optical communications systems receive transmitted optical signals and perform optical signal processing and photodetection to generate an electrical received signal. An electrical signal processor processes the electrical received signal to demodulate and recover the transmitted information. State-of-the art optical receivers used for digital optical communication systems are required to perform well under noisy conditions. For example, receivers used for optical communication systems, such as high data rate optical transceivers and transponders, are expected to perform well under non-ideal signal conditions, which include the presence of amplified spontaneous emission (ASE) noise, thermal noise, timing jitter, and various types of fiber dispersion related pulse distortions.

In many digital communications system, the clock and data signals are combined into the transmitted signal to ensure that the clock and data signals always arrive at the receiver at the same time. Digital receivers used for many types of communication systems need to recover the system clock from the received signal in order to demodulation the signal to obtain the transmitted information. However, it is sometimes difficult to separate the clock and data signals at the receiver, especially when the signal has degraded during transmission. Phase lock loops are commonly used to recover the system clock. As the input signal degrades, the phase lock loop in the clock recovery circuit begins to lose lock, which can result in a loss of received data condition.

BRIEF DESCRIPTION OF THE DRAWINGS

The aspects of this invention may be better understood by referring to the following description in conjunction with the accompanying drawings. Identical or similar elements in these figures may be designated by the same reference numerals. Detailed descriptions about these similar elements may not be repeated. The drawings are not necessarily to scale. The skilled artisan will understand that the drawings, described below, are for illustration purposes only. The drawings are not intended to limit the scope of the present teachings in any way.

DETAILED DESCRIPTION

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

It should be understood that the individual steps of the methods of the present invention may be performed in any order and/or simultaneously as long as the invention remains operable. Furthermore, it should be understood that the apparatus and methods of the present invention can include any number or all of the described embodiments as long as the invention remains operable.

The present teachings will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teachings herein will recognize additional implementations, modifications, and embodiments, as well as other fields of use, which are within the scope of the present disclosure as described herein. For example, although some aspects of the present invention are described in connection with an optical fiber communications system, it should be understood that the methods and apparatus of the present invention can be used with any type of optical communication system.

Figure 1:
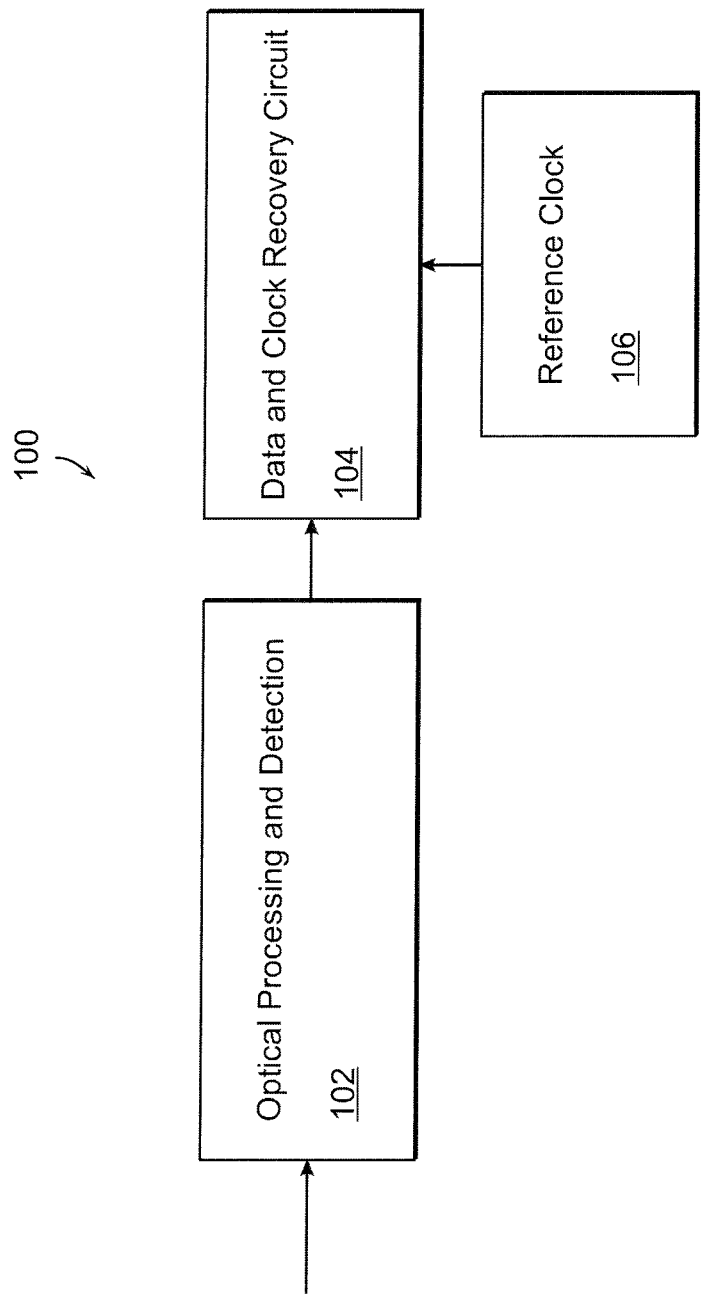
FIG. 1 illustrates a block diagram of a known optical receiver that is commonly used for optical digital communication systems.

FIG. 1 illustrates a block diagram of an optical receiver 100 that is commonly used for optical digital communication systems. The optical receiver 100 includes an optical processing and detection unit 102 that receives the transmitted optical signal and processes the optical signals using optical filters and other components before optical detection and conversion into an electrical signal. A photodetector detects the processed optical signal and converts it to an electrical data signal. Amplifiers may be used to amplify the detected electrical data signal. A signal processing circuit, which can include automatic gain control circuits and limiting amplifiers, can be used to process the detected electrical data signal.

A data and clock recovery circuit 104 receives the processed electrical data signal and recovers the system clock signal for demodulation. Phase lock loops are widely used in these data and clock recovery circuits to lock onto a tone from the electrical data signal. Phase lock loops are easy to integrate and relatively inexpensive, compared to other technologies. The clock recovery circuit 104 receives an electrical signal from the optical processing and detection unit 102 and generates a clock signal having a frequency that is harmonically related to the single channel bit rate and that is synchronized or locked to the received optical data signal.

Conventional phase lock loop circuits include a reference clock 106 that generates a reference clock signal that is used by a voltage controlled oscillator in the phase lock loop to lock onto a tone from the electrical data signal. The reference clock 106 generates a reference clock signal having a frequency that is harmonically related to a single channel bit rate and that is synchronized or locked to the received optical data signal.

Recently, phase lock loop circuits that do not require a reference clock have been used in optical receivers. See, for example, U.S. Pat. No. 6,307,413. Such phase lock loop circuits are advantageous because they can simplify the system design. These phase lock loop circuits use the frequency and phase detector to track the input signal. Some of these circuits sweep a voltage controlled oscillator frequency for the entire frequency range to search for a lock. When the phase detector finds the locking frequency, the sweep stops.

However, these phase lock loop circuits that do not require a reference clock are not as capable as conventional phase lock loop circuits that use reference clocks to lock to the input signal because these phase lock loop circuits use only the input signal to achieve a phase locking condition. As a result, these phase lock loop circuits fail to lock and recover the input signal under degraded signal quality conditions. Also, once these phase lock loop circuits lose their locking condition, they require a much better quality signal to again establish a locking condition compared with conventional phase lock loop circuits. Consequently, there is a relatively large hysteresis effect in the performance of these phase lock loop circuits.

Figure 2:
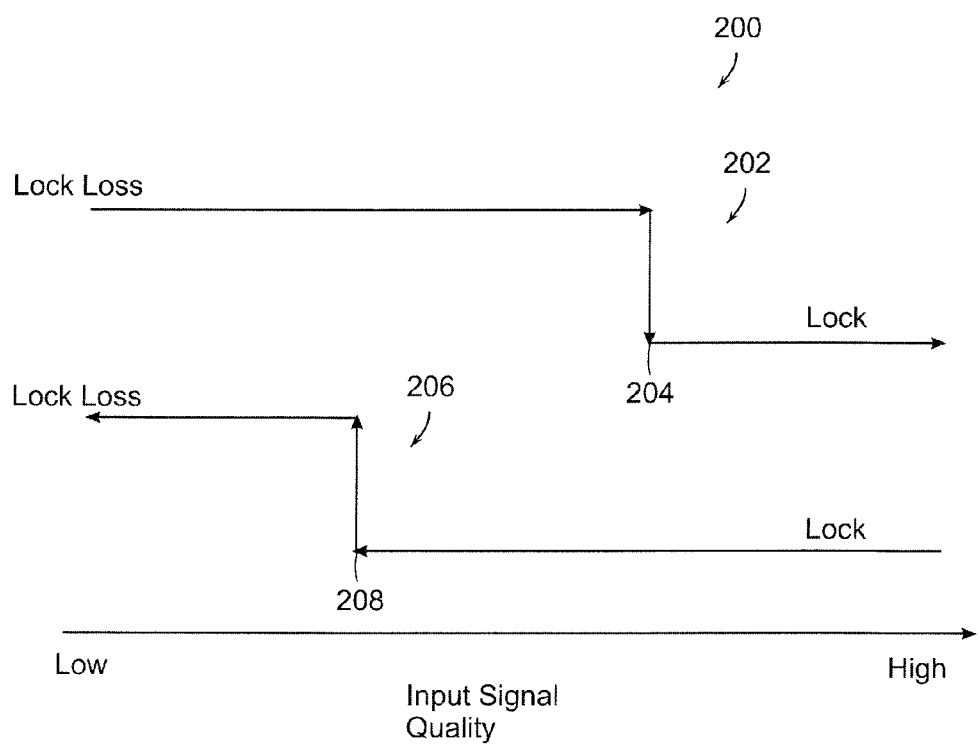
FIG. 2 presents signal locking diagrams for known phase lock loop circuits that illustrate hysteresis in the signal lock and signal loss lock characteristics.

FIG. 2 presents signal locking diagrams 200 for known phase lock loop circuits that illustrate hysteresis in the signal lock and signal loss lock characteristics. The signal locking diagrams 200 illustrate signal lock or signal loss lock as a function of input signal quality from relatively low input signal quality to relatively high input signal quality. The first signal locking diagram 202 illustrates a transition from a signal lock loss condition to a signal lock condition at a signal locking threshold 204 as the input signal quality improves from a relatively low input signal quality to relatively high input signal quality. The second signal locking diagram 206 illustrates a transition from a signal locking condition to a signal lock loss condition at a signal loss lock threshold 208 as the input signal quality degrades from a relatively high input signal quality to a relatively low input signal quality.

The second signal locking diagram 206 illustrates that once the phase lock loop locks onto the signal, it will remain locked as the signal degrades beyond the signal locking threshold 204, which results in a hysteresis in the signal lock and signal loss lock characteristics. The hysteresis is due to a known difference between the phase lock loop circuit's lock-in and pull-in characteristics, which are much larger for phase lock loop circuits that do not use a reference clock. The hysteresis in phase lock loop circuits limits the capabilities of many known optical receivers.

The present invention relates to methods and apparatus that improve the signal locking and clock recovery capability of optical receives in order to achieve an increase in the minimum required optical signal-to-noise ratio in the received optical signal and to obtain more reliable system operation with less information traffic flow interruptions.

Figure 3:
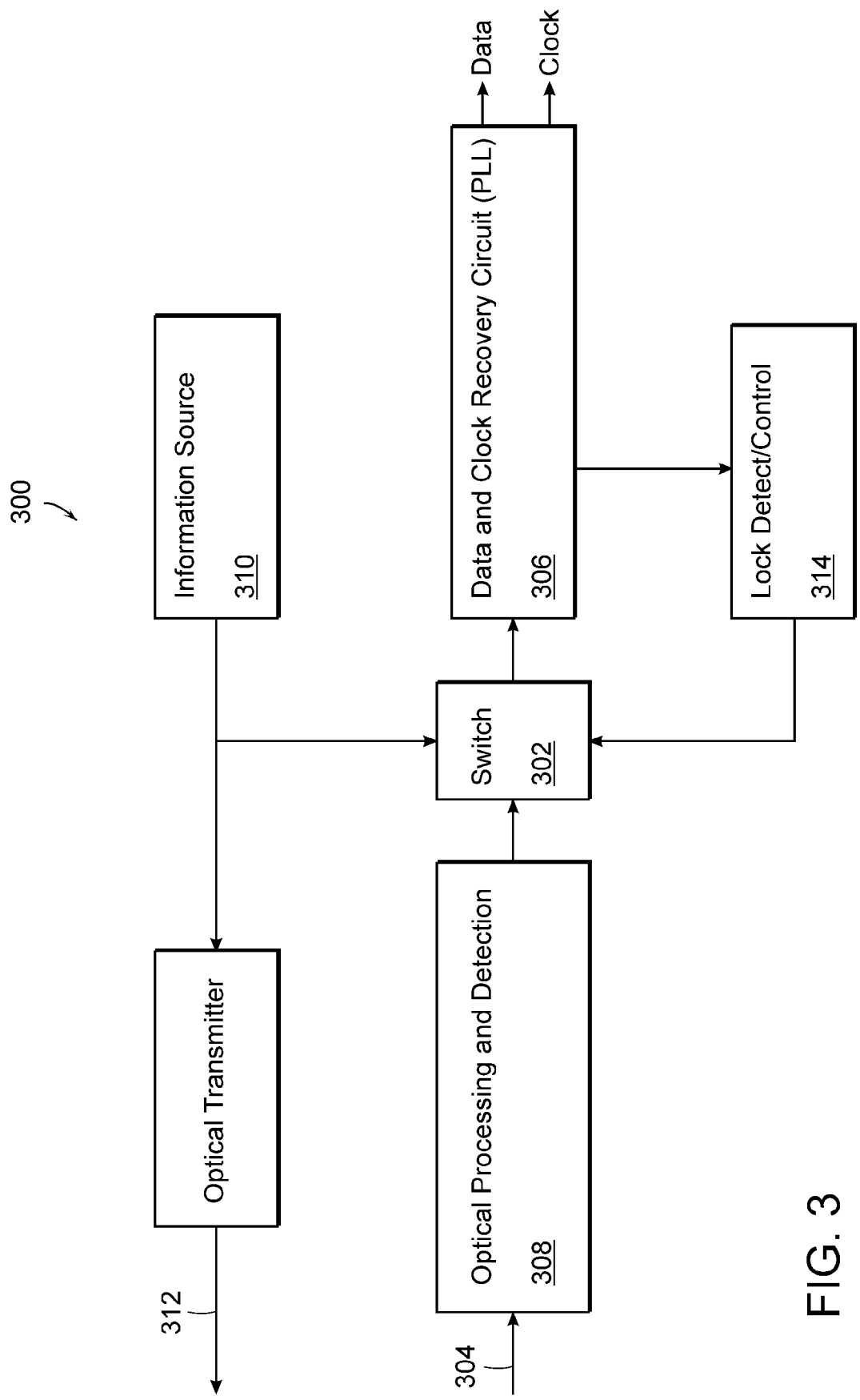
FIG. 3 illustrates a block diagram of an optical receiver according to the present invention that includes an electrical switch positioned in the received data signal path before the data and clock recovery circuit that switches traffic from the received data signal path to a second signal path in order to maintain a phase locking condition at the optical receiver.

FIG. 3 illustrates a block diagram of an optical receiver 300 according to the present invention that includes an electrical switch 302 positioned in the receiver channel 304 before the data and clock recovery circuit 306 that switches traffic from the receiver channel 304 to a second signal path in order to maintain a phase locking condition in the optical receiver 300. The block diagram of the optical receiver 300 illustrates an optical processing and detection unit 308 that receives a first optical data signal propagating in the receiver channel 304 and generates an electrical detection signal. In one embodiment, the received optical data is received from an optical channel or optical link in an optical fiber communications system.

The output of the optical processing and detection unit 308 is electrically connected to a first input of the electrical switch 302. A second input of the electrical switch 302 is electrically connected to an output of an electrical information source 310 that generates a second electrical data signal. In the embodiment shown in FIG. 3, the second electrical data signal is an electrical data signal that is used to modulate a second optical data signal for propagation through the transmit optical channel 312 in a direction that is opposite to the direction that the received optical signal propagates through the receiver channel 304. However, in various other embodiments, the second electrical data signal can be a data signal generated by a fixed or variable data pattern generator or can be a reference signal generated by a reference signal or reference clock generator.

The output of the electrical switch 302 is electrically connected to a data and clock recovery circuit 306 that includes a phase lock loop. The data and clock recovery circuit 306 receives the processed electrical data signal and recovers the system clock signal for demodulation. An output of the data and clock recovery circuit 306 is electrically connected to an input of a lock detection circuit 314. In various embodiments, the lock detection circuit 314 can be separate from or combined with the data and clock recovery circuit 306. An output of the lock detection circuit 314 is electrically connected to a control input of the electrical switch 302.

The lock detection circuit 314 determines if a sufficient signal locking condition is established from the signal generated by the data and clock recovery circuit 306. Based upon the determination, the lock detection circuit 314 generates a control signal at a control output that instructs the electrical switch 302 to either pass the received electrical data signal or to pass the second electrical data signal depending upon the state of the signal locking of the received electrical data signal.

In operation, the received optical data signal is processed and detected by the optical processing and detection unit 308 thereby generating a received electrical data signal. The received electrical data signal is then passed through the electrical switch 302 to the data and clock recovery circuit 306. The data and clock recovery circuit 306 attempts to achieve a signal locking condition for the received electrical data signal. If a signal locking condition is achieved by the data and clock recovery circuit 306, the electrical switch 302 continues to pass the received electrical data signal to the data and clock recovery circuit 306 where the system clock is recovered and the received data is demodulated to obtain the received information transmitted in the optical channel.

Conversely, if the data and clock recovery circuit 306 fails to achieve a signal locking condition with the received electrical data signal or if the signal quality of the received electrical data signal degrades to a level where the electrical data signal becomes un-locked, the input signal to the data and clock recovery circuit 306 needs to be improved in order for the phase lock loop circuit in the data and clock recovery circuit 306 to re-establish a signal locking condition. The lock detection circuit 314 detects the failure to lock to the received electrical data signal and then generates a control signal at the output which instructs the electrical switch to switch traffic passed by the electrical switch 302 from the received electrical data signal to the second electrical data signal.

In various embodiments, the second electrical data signal can be an electrical data signal from any of numerous types of data sources. In one specific embodiment, the optical channel is a bi-directional channel where the second electrical data signal is the electrical data signal that is used to modulate the second optical data signal for propagation back through the transmitter channel 312. Optical communications systems with bi-directional traffic flow are commonly used in optical communications systems.

In one embodiment, the second electrical data signal is a relatively high signal-to-noise ratio electrical data signal compared with the received electrical data signal that was transmitted over the receiver optical channel 304, which can be a long haul optical transmission system. For example, in some embodiments, the second electrical data signal is a high quality electrical data signal that is generated by an electrical data transmitter and multiplexer that is in close physical proximity to the optical receiver and electrical switch 302. In this embodiment, the phase lock loop circuit in the data and clock recovery circuit 306 rapidly achieves a signal locking condition with the second electrical data signal because of its high signal-to-noise ratio.

At a predetermined time after the clock recovery circuit 306 has locked onto the second electrical data signal, the electrical switch 302 switches the received electrical data signal back to the input of the data and clock recovery circuit 306. If the signal quality of the received optical signal has improved to the level that the phase lock loop circuit in the data and clock recovery circuit 306 can lock onto the received electrical data signal, the electrical switch 302 continues to pass the received electrical data signal. Conversely, if after a predetermined time delay, which is chosen to ensure that an acceptable signal lock is achieved, the received electrical data signal has not improved to the level that the phase lock loop in the data and clock recovery circuit 306 can lock onto the received electrical data signal, the electrical switch 302 switches the second electrical data signal back to the input of the data and clock recovery circuit 306.

This method of the electrical switch toggling back and forth between passing the received electrical data signal and passing the second electrical data signal is repeated until the lock detection circuit 314 determines that the data and clock recovery circuit 306 has locked onto the received electrical data signal. This method of the present invention uses the second electrical data signal as a reference signal instead of a separate reference clock that is used in most prior art data and clock recovery circuits.

One feature of the method and apparatus of the present invention is that the hysteresis in the signal lock and signal loss lock characteristics is significantly reduced compared with prior art optical receivers. Another feature of the method and apparatus of the present invention is that there is no interference with normal traffic flow. The electrical switch 302 is transparent unless the received electrical data signal is or becomes severely degraded and the data and clock recovery circuit 306 fails to lock onto the received electrical data signal for a predetermined time period.

Another feature of the method and apparatus of the present invention is that it can be easily implemented in many commercial optical fiber communications systems because many of these systems include a diagnostic signal path that can be used to couple the second electrical data signal to the input of the electrical switch 302. This diagnostic signal path is sometimes called a "loop back signal path." Therefore, no special or dedicated channels need to be used to practice the invention in commercial systems.

In normal operation of practical optical data transmission systems, there are known events that cause enough signal degradation for a signal lock loss condition to occur where the electrical switch 302 switches the second electrical data signal to the input of the data and clock recovery circuit 306. One known event is during the initial startup of the communications system when severely degraded signal conditions are often present at the input of the optical receiver 300. During the initial startup, the electrical switch 302 will toggle back and forth between passing the received electrical data signal and passing the second electrical data signal until the lock detection circuit 314 determines that the data and clock recovery circuit 306 has locked onto the received electrical data signal.

Another known event that causes enough signal degradation for a signal lock loss condition to occur and the electrical switch 302 to switch the second electrical data signal to the input of the data and clock recovery circuit 306 is when the signal at the input of the optical receiver 300 becomes severely degraded due to deteriorating signal transmission conditions in the receiver channel 304. However, once the phase lock loop circuit in the data and clock recovery circuit 306 is locked onto a signal, it will remain locked as long as the signal conditions remain within a predetermined range of signals that depends upon the hysteresis of the phase lock loop in the data and clock recovery circuit 306 as described in connection with FIG. 2.

As long as the signal conditions remain within the predetermined range of signals, there is no break in information traffic. Once the signal conditions degrade to a level that is outside of the predetermined range of signals, the electrical data signal becomes un-locked and the electrical switch 302 toggles back and forth between passing the received electrical data signal and passing the second electrical data signal until the lock detection circuit 314 determines that the data and clock recovery circuit 306 has again locked onto the received electrical data signal.

Figure 4:
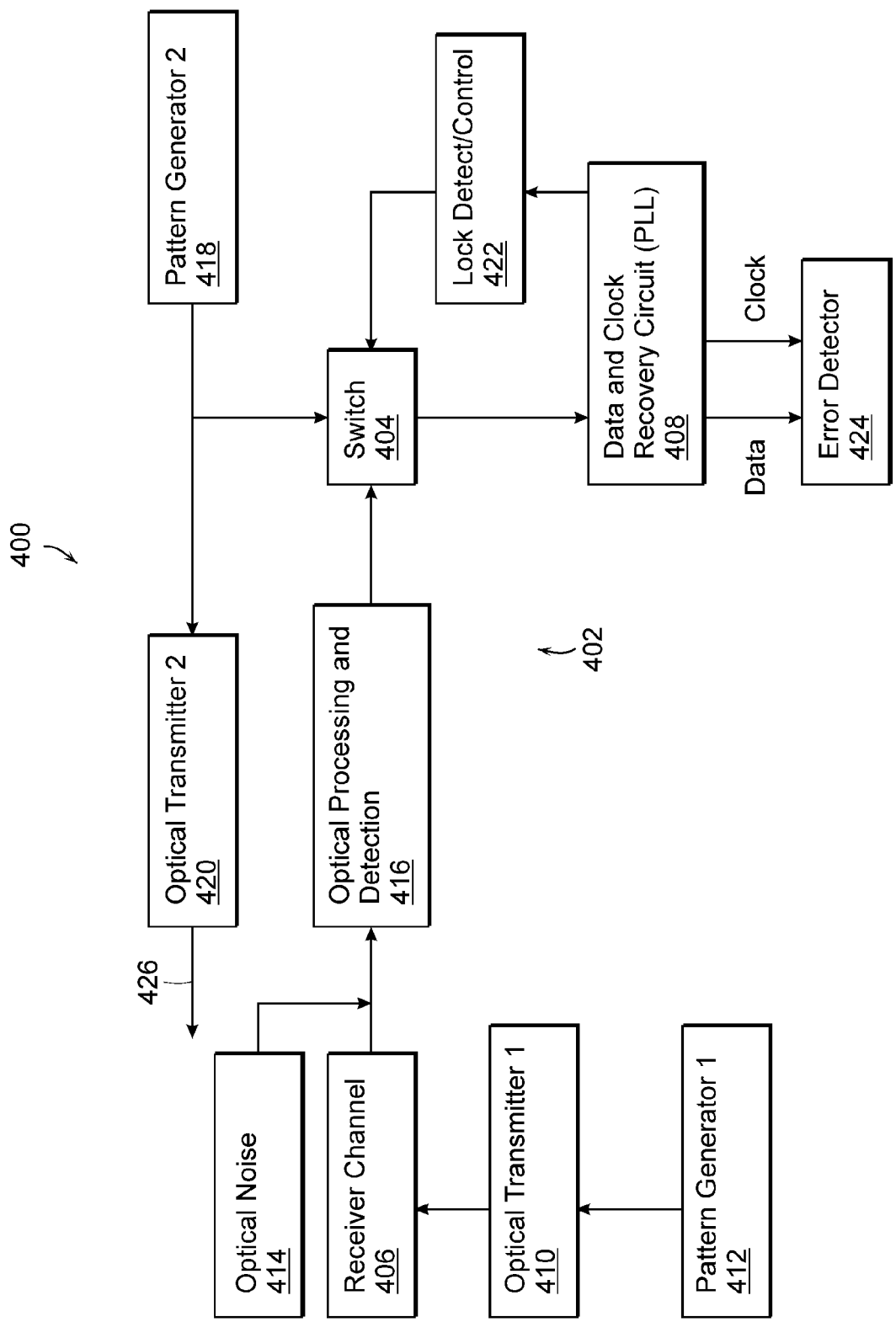
FIG. 4 illustrates a block diagram of an optical transmission system used to test and measure the performance of an optical receiver according to the present invention

FIG. 4 illustrates a block diagram of an optical transmission system 400 used to test and measure the performance of an optical receiver according to the present invention. The optical transmission system 400 includes an optical receiver 402 that is similar to the optical receiver 300 described in connection with FIG. 3 which includes an electrical switch 404 that is positioned in the optical fiber receiver channel 406 before the data and clock recovery circuit 408 that switches traffic from the receiver channel 406 to a second signal path in order to maintain a phase locking condition at the optical receiver 400.

The optical transmission system 400 includes a first optical transmitter 410 with an output that is coupled to the receiver channel 406. An output of a first data pattern generator 412 is electrically coupled to a modulation input of the first optical transmitter 410. The first data pattern generator 412 provides a digital data stream to the first optical transmitter 410 and the first optical transmitter converts the digital data stream into a modulated optical NRZ data pulse train.

The first optical transmitter 410 modulates an optical carrier with the electrical data signal to generate a first optical data signal. An output of an optical noise generator 414 is optically coupled to the optical fiber 406 of the receiver channel. The optical noise generator 414 introduces optical noise into the receiver channel 406 in order to simulate deteriorating signal transmission conditions in the receiver channel 406.

An optical processing and detection unit 416 receives the first optical data signal propagating in the receiver channel 406 and generates an electrical detection signal. The output of the optical processing and detection unit 416 is electrically connected to a first input of the electrical switch 404. A second input of the electrical switch 404 is electrically connected to an output of a second data pattern generator 418 that generates a second electrical data signal. A second optical transmitter 420 includes a modulation input that is electrically connected to an output of the second pattern generator 418 that provides a second digital data stream to the second optical transmitter 420. The second optical transmitter 420 converts the digital data stream into a modulated optical NRZ data pulse train. The second optical transmitter 420 modulates an optical carrier with the second electrical data signal for transmission through an optical fiber transmission channel 426 in the optical transmission system 400.

The output of the electrical switch 404 is electrically connected to the data and clock recovery circuit 408 that includes a phase lock loop as described in connection with the optical receiver shown in FIG. 3. The data and clock recovery circuit 408 receives the processed electrical data signal and recovers the system clock signal for demodulation. An output of the data and clock recovery circuit 408 is electrically connected to an input of a lock detection circuit 422, which can be separate from or combined with the data and clock recovery circuit 408. An output of the lock detection circuit 422 is electrically connected to a control input of the electrical switch 404. An error detection circuit 424 is electrically coupled to a clock and data output of the data clock recovery circuit 408. The error detection circuit 424 determines the bit error rate in the received electrical data signal.

The operation of the receiver in the optical transmission system 400 is similar to the operation of the receiver 300 that was described in connection with FIG. 3. The first optical data signal is processed and detected by the optical processing and detection unit 416 thereby generating a received electrical data signal. The received electrical data signal is then passed through the electrical switch 404 to the data and clock recovery circuit 408.

The data and clock recovery circuit 408 attempts to achieve a signal locking condition with the electrical data signal. If a signal locking condition is achieved by the data and clock recovery circuit 408, the electrical switch 404 continues to pass the first electrical data signal to the data and clock recovery circuit 408 where the system clock is recovered and the received data is demodulated to obtain the transmitted information. Conversely, if the data and clock recovery circuit 408 fails to lock to the first electrical data signal in a predetermine time or if the signal quality of the electrical data signal degrades to the level that the electrical data signal becomes un-locked, the lock detection circuit 422 detects the failure to lock to the first electrical data signal and then generates a control signal at the output which instructs the electrical switch 404 to switch traffic passed by the electrical switch 404 from the first electrical data signal to the second electrical data signal generated by the second pattern generator 418.

Instructing the electrical switch 404 to switch traffic to the second electrical data signal forces the phase lock loop in the data and clock recovery circuit 408 to lock onto the second electrical data signal. The electrical switch 404 then toggles back and forth between passing the first electrical data signal and then passing the second electrical data signal until the lock detection circuit 422 determines that the data and clock recovery circuit 408 has locked onto the first electrical data signal.

Figure 5A:
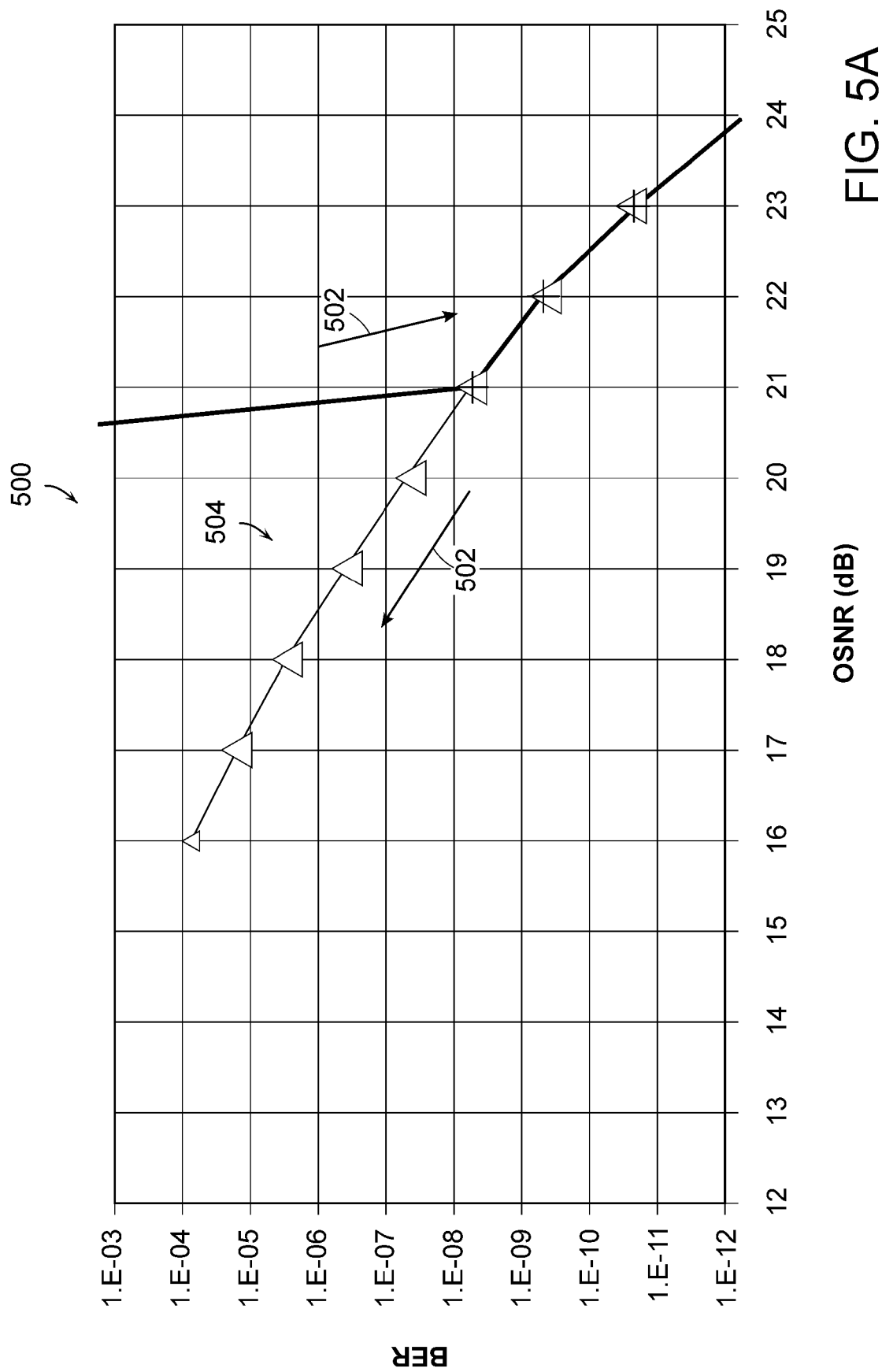
FIG. 5A presents a plot of bit error rate as a function of optical signal-to-noise ratio for a known optical receiver operating with an 11 Gb/s data rate, an optical fiber length equal to 90 km, and with an optical signal-to-noise ratio at the receiver input that was varied from about 16 dB to 24 dB.

FIG. 5A presents a plot 500 of bit error rate as a function of optical signal-to-noise ratio for a known optical receiver operating with an 11 Gb/s data rate, an optical fiber length equal to 90 km, and for an optical signal-to-noise ratio at the receiver input that was varied from 16 dB to 24 dB. The plot 500 of bit error rate indicates that a loss of signal lock condition occurs when the optical signal-to-noise ratio is in the range of 14 dB to 21 dB. This loss of signal lock condition results in an unacceptably high bit error rate. The bit error rate characteristic shown in the plot 500 is sometimes called an optical signal-to-noise ratio water fall because the optical signal-to-noise ratio decreases so rapidly when the loss of signal lock condition occurs.

In addition, the plot 500 indicates that the phase lock loop in the receiver achieves a signal lock with a bit error rate of $10^{-8}$ at an optical signal-to-noise ratio that is about 21 dB. Therefore, the system performance is severely limited because the system can only operate at relatively high optical signal-to-noise ratios. In other words, useful receiver operation occurs only when the optical signal-to-noise ratio is greater than about 21 dB. When the phase lock loop in the optical receiver achieves a signal locking condition, it remains locked until the optical signal-to-noise ratio degrades to a level that is below about 16 dB. Hysteresis in the bit error rate characteristic is indicated by arrows 502 in the plot 500. The hysteresis results because the phase lock loop fails to achieve a signal locking condition with the first electrical data signal when the optical signal-to-noise ratio of the received optical signal is in the range of about 16 to 20 dB at initial startup, as shown by region 504 in the plot 500.

Figure 5B:
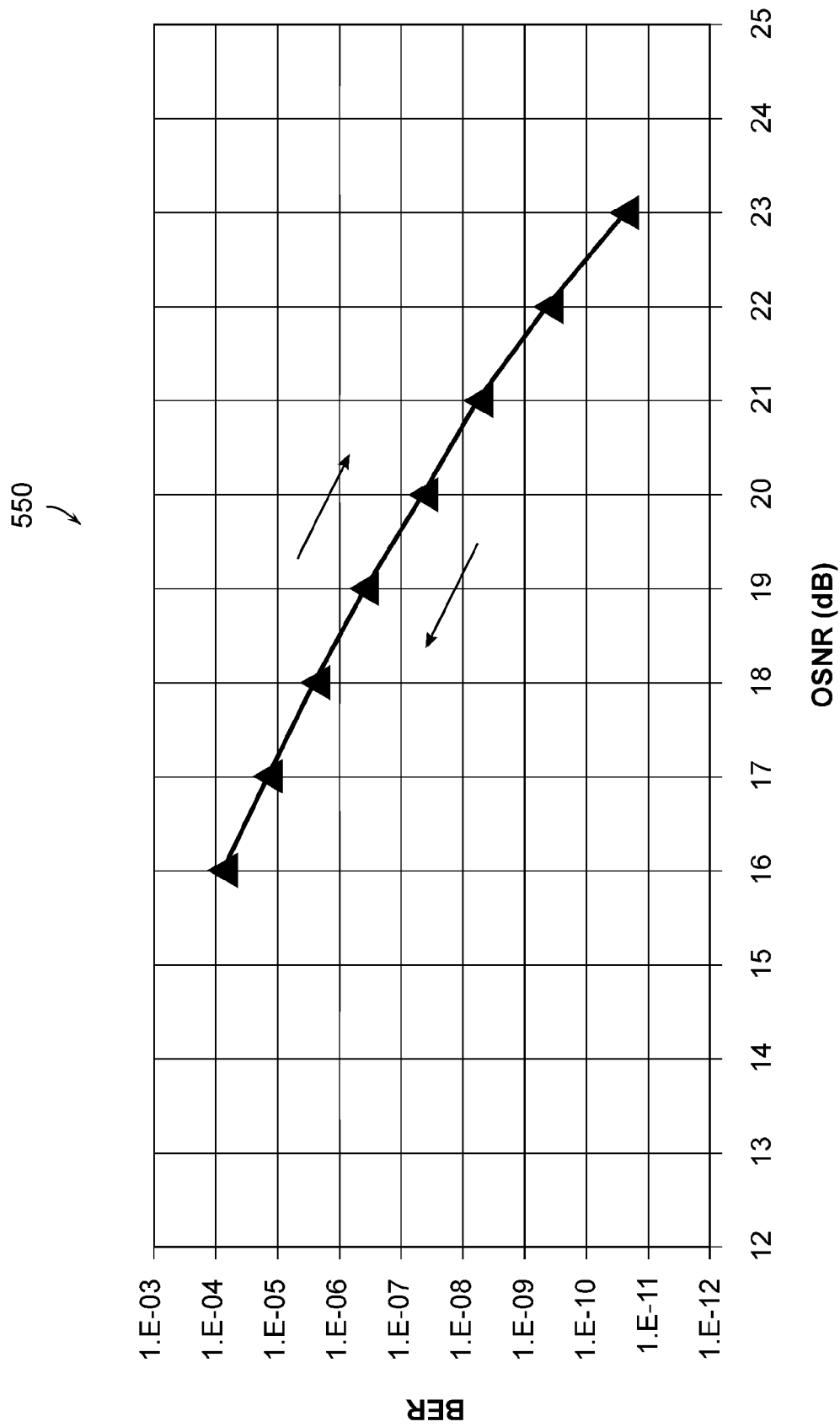
FIG. 5B presents a plot of bit error rate as a function of optical signal-to-noise ratio for an optical receiver having an electrical switch according to the present invention and operating with an 11 Gb/s data rate, an optical fiber length equal to 90 km, and with an optical signal-to-noise ratio at the receiver input that was varied from about 16 dB to 23 dB.

FIG. 5B presents a plot 550 of bit error rate as a function of optical signal-to-noise ratio for an optical receiver having an electrical switch according to the present invention and operating with an 11 Gb/s data rate, an optical fiber length equal to 90 km, and with an optical signal-to-noise ratio at the receiver input that was varied from 16 dB to 23 dB. The plot 550 indicates that the phase lock loop circuit in the optical receiver with the electrical switch according to the present invention achieves a signal lock condition even during the initial start up when the optical signal-to-noise ratio is only about 16 dB. The electrical switch in the optical receiver according to the present invention will only operate once under these transmission conditions, at the beginning of the measurement when the optical signal-to-noise ratio of the received optical signal is about 16 dB. Once the phase lock loop in the optical receiver achieves a signal locking condition, the switch will remain in the received signal locked state and pass the received electrical signal for the duration of the measurement cycle.

Therefore, the optical-signal-noise ratio for a receiver having the electrical switch according to the present invention can operate with received optical signals having a minimum optical signal-to-noise ratio that is at least 5 dB lower than a similar known optical receiver that does not include the electrical switch of the present invention. In addition, an optical receiver having the electrical switch according to the present invention does not exhibit any hysteresis as indicated by the arrow 552. These experiments show that the methods and apparatus of the present invention improve the timing recovery capability of the optical receiver so that it can achieve a signal locking condition with the incoming signal when the received electrical data signal has a lower signal-to-noise ratio. The methods and apparatus of the present invention also result in more reliable receiver operation.

EQUIVALENTS

While the present teachings are described in conjunction with various embodiments and examples, it is not intended that the present teachings be limited to such embodiments. On the contrary, the present teachings encompass various alternatives, modifications and equivalents, as will be appreciated by those of skill in the art, may be made therein without departing from the spirit and scope of the invention.

What is claimed is:

1. An optical receiver comprising:
   a. an optical detector having an input that is positioned to detect an optical data signal received from an optical channel, the optical detector generating a received electrical data signal at an output;
   b. an electrical switch having a first input that is electrically coupled to output of the optical detector and a second input that is electrically coupled to an electrical data source that generates a second electrical data signal, the electrical switch passing one of the received electrical data signal and the second electrical data signal depending upon a control signal applied to a control input; and
   c. a data and clock recovery circuit having an input that is electrically connected to the output of the electrical switch and a control output that is electrically connected to the control input of the electrical switch, the data and clock recovery circuit generating a recovered clock and a recovered data signal when a signal-to-noise ratio of the received electrical signal is in a range where a signal locking condition is established, and generating the control signal at the control output that instructs the electrical switch to select the received electrical data signal if the signal locking condition is established and to select the second electrical data signal if the signal locking condition is not established.

2. The optical receiver of claim 1 wherein the second electrical data signal is modulated by an optical transmitter that transmits a resulting modulated optical signal in a transmission optical channel.

3. The optical receiver of claim 1 wherein the data and clock recovery circuit comprises a lock detection and control circuit that determines if the data and clock recovery circuit has established a signal locking condition with the received electrical data signal and generates a control signal responsive to the determination.

4. The optical receiver of claim 1 further comprising a lock detection and control circuit that determines if the data and clock recovery circuit has established a signal locking condition with the received electrical data signal and generates a control signal responsive to the determination.

5. The optical receiver of claim 1 further comprising an optical filter positioned at an input of the optical receiver, the optical filter processing the optical data signal received from an optical channel before the optical detector detects the optical data signal received from an optical channel.

6. The optical receiver of claim 1 wherein there is substantially no hysteresis in the signal lock and the signal loss lock characteristics of the optical receiver.

7. An optical transmission system comprising:
   a. an optical transmitter having an output that is optically coupled to a transmission optical channel, the optical transmitter comprising a transmission data source that generates a transmission electrical data signal at an output and an optical modulator having a modulation input electrically connected to the output of the transmission data source, the optical modulator generating an optically modulated transmission signal at the output that propagates through the transmission optical channel;
   b. an optical receiver having an input that is optically coupled to a receiver optical channel, the optical receiver comprising an optical detector that generates a received electrical data signal from a received optical signal and an electrical switch having a first input that is electrically coupled to output of the optical detector and a second input that is electrically coupled to the output of the transmission data source, the electrical switch passing one of the received electrical data signal and the transmission electrical data signal at an output; and
   c. a data and clock recovery circuit having an input that is electrically connected to the output of the electrical switch and an output that is electrically connected to the control input of the electrical switch, the data and clock recovery circuit generating a recovered clock and a recovered data signal when a signal-to-noise ratio of the received electrical signal is in a range where a signal locking condition is established and generating the control signal at the output that instructs the electrical switch to select the received electrical data signal if the signal locking condition is established and that instructs the electrical switch to select the transmission electrical data signal if the signal locking condition is not established.

8. The optical transmission system of claim 7 wherein the transmission optical channel propagates in a direction that is opposite to a direction of the receiver optical channel.

9. The optical transmission system of claim 7 wherein the data and clock recovery circuit comprises a lock detection and control circuit that determines if the data and clock recovery circuit has established a signal locking condition with the received electrical data signal.

10. The optical transmission system of claim 7 further comprising a lock detection and control circuit that is electrically connected to the data and clock recovery circuit, the lock detection and control circuit determining if the data and clock recovery circuit has established a signal locking condition with the received electrical data signal.

11. The optical transmission system of claim 7 further comprising an optical filter positioned at an input of the optical receiver, the optical filter processing the optical data signal received from an optical channel before the optical detector detects the optical data signal received from an optical channel.

12. A method of receiving an optical data signal, the method comprising:
   a. detecting the optical data signal received from an optical channel with an optical detector and generating a received electrical data signal;
   b. establishing a signal locking condition in response to an input signal quality of the received electrical data signal;
   c. recovering the data and clock signal if the signal locking condition in response to the input signal quality of the received electrical data signal is locked;
   d. switching from the received electrical data signal to a second electrical data signal with an electrical switch for a predetermined time if the signal locking condition in response to the input signal quality of the received electrical data signal is unlocked, the electrical switch having a first input that is electrically coupled to an output of the optical detector and a second input that is electrically coupled to an electrical data source that generates the second electrical data signal, and an output that is connected to a data and clock recovery circuit;
   e. switching the electrical switch to the received electrical data signal after the predetermined time; and
   f. determining in response to the input signal quality of the received electrical data signal if the signal locking condition is locked.

13. The method of claim 12 further comprising optical filtering the optical data signal before the detecting the optical data signal received from the optical channel.

14. The method of claim 12 further comprising performing the steps of establishing if a signal locking condition is locked with the second electrical data signal for the predetermined time and then determining if the signal locking condition can be established after the predetermined time.

15. The method of claim 12 further comprising performing the step of establishing a locked signal locking condition with the second electrical data signal for a predetermined time after an unlocked signal locking condition occurs with the received electrical data signal and then determining if a locked signal locking condition can be established with the received electrical data signal after the predetermined time.

16. The method of claim 15 further performing the step of establishing a locked signal locking condition with the second electrical signal for the predetermined time and then determining if a locked signal locking condition with the received electrical data signal can be established after the predetermined time a plurality of times until a locked signal locking condition with the received electrical data signal is established.

17. The method of claim 15 wherein there is substantially no hysteresis in the locked signal locking condition and the unlocked signal locking condition.

18. The method of claim 12 further comprising modulating the second electrical signal and transmitting the modulated second electrical signal in a transmission channel.

* * * * *